United States Patent [19]

Berger et al.

[11] Patent Number: 5,696,629
[45] Date of Patent: Dec. 9, 1997

[54] OPTICAL COMPONENT COMPRISING LAYERS OF POROUS SILICON

[75] Inventors: Michael Götz Berger, Wachtberg-Pech; Herbert Münder, Bergheim; Stephan Frohnhoff, Aachen; Markus Thönissen, Nettetal; Hans Lüth, Aachen, all of Germany

[73] Assignee: Forschungszentrum Julich GmbH, Julich, Germany

[21] Appl. No.: 564,335

[22] PCT Filed: Jun. 8, 1994

[86] PCT No.: PCT/DE94/00635

§ 371 Date: Dec. 4, 1995

§ 102(e) Date: Dec. 4, 1995

[87] PCT Pub. No.: WO94/29757

PCT Pub. Date: Dec. 22, 1994

[30] Foreign Application Priority Data

Jun. 14, 1993 [DE] Germany ............ 43 19 413.3

[51] Int. Cl.⁶ .................................. G02B 5/28
[52] U.S. Cl. ............... 359/582; 359/586; 359/589
[58] Field of Search ................. 359/581, 582, 359/653, 654, 655, 586, 589

[56] References Cited

U.S. PATENT DOCUMENTS 4,271,210  6/1981  Yoldas ........................ 427/169
4,535,026  8/1985  Yoldas et al. ................ 359/654
5,218,472  6/1993  Jozefowicz et al. .......... 359/585

FOREIGN PATENT DOCUMENTS

A 61170702  8/1986  Japan ................ G02B 1/10

OTHER PUBLICATIONS

J. G. wilder, "Porous Silicon AR Coating for Use at 248 nm or 266 nm", Applied Optics vol. 23, No. 10, pp. 1448–1449 15 May 1984.

"IR Spectroscopic ellipsometry: Instrumentation and applications in semiconductors" by Gilbert alcser, published in Thin Solid Films, 234 356–362 25 Oct. 1993.

Primary Examiner—Paul M. Dzierzynski
Assistant Examiner—John Juba, Jr.
Attorney, Agent, or Firm—Herbert Dubno

[57] ABSTRACT

The invention relates to an optical component consisting of transparent thin layers of differing thickness and refractive indices. Such optical components are used, for example, as interference filters and mirrors. Optical components made of layers with gradually changing refractive indices are also known as waveguides of anti-reflective coatings. The invention achieves the aim of using, instead of layers of ordinary materials, another material by means of a component in which the layers consist of porous silicon. The special advantages of porous silicon as a coating material arises not only from the ease and economy of manufacture, but also in the facility for obtaining gradual refractive index transitions. It is therefore very easily possible to make waveguides on a silicon chip.

4 Claims, 5 Drawing Sheets

OPTICAL COMPONENT COMPRISING LAYERS OF POROUS SILICON

CROSS REFERENCE TO RELATED APPLICATIONS

This application is a national stage application of PCT/DE 94/00635 filed 8 Jun. 1994 and based in turn upon German National Application P 43 19 413.3 filed 14 Jun. 1993 under the International Convention.

BACKGROUND OF THE INVENTION

1. Field of the Invention

The invention relates to an optical component comprised of transparent thin layers of different thicknesses and differing refractive indexes.

2. Description of Related Art

Such optical components have been known for a long time. Thus, for example, optical components have been used whose operation depends upon interference effects in thin layers. These include for example interference filters and mirrors. The geometric effect of a layer sequence which, inter alia, is composed of layers of two materials which have different refractive indexes is determined by an appropriate selection of the layer sequence and the optical thicknesses of the individual layers. The so-called optical thickness of the layer is the thickness of the layer multiplied by the refractive index. These optical thicknesses are usually whole fractions of the respective wavelengths which are selected for the filter or mirror. Thus a so-called Bragg reflector can be comprised of a periodic layer sequence of two layers with the greatest possible difference in refractive index and an optical layer thickness each of ¼ of the respective wavelength for which the reflector has an optimum effect. In contrast thereto, there is a Fabry-Perot filter which has a somewhat modified layer sequence which provides a high transmission for a predetermined wavelength while for other wavelengths the filter is opaque. Optical components from layers with gradually varying refractive index are known as waveguides or as anti-reflection coatings.

SUMMARY OF THE INVENTION

It is an object of the invention to substitute another material for the layers of the materials customarily used.

This object is achieved according to the invention in that the layers are comprised of porous silicon.

The production of a layer system of porous silicon can be realized in different ways:

a) By variation of the current density in electrochemical etching processes for the production of porous silicon, the porosity and thus the optical characteristics of an individual layer can be affected in a very simple manner.

b) The use of a layer sequence of differently doped silicon layers as the starting material for the etching process give rise to a change in the microstructure and thus the optical characteristics. With the differently doped layers for the starting material, a variation in the level and also the kind of doping is conceivable. Thus, inter alia, the following doping sequences can be considered: $p^+pp^+$, npnp, pipi, gradual transition $p \rightarrow p^+$ c) With different etching processes on Si and SiGe, a layer sequence of Si/SiGe can produce a porous layer system.

d) The influence of exposure (illumination) of the sample during the etching process for the microstructures can be used to produce layer systems according to the invention. The variation of the intensity of the illumination and also a change in the spectrum of the incident light are possible.

The processes mentioned under a) through d) can be combined with one another to field a layer system with the optimum optical characteristics.

The layer system of the invention depending upon the desired application can be varied and thus the emission characteristic or absorption characteristic of a light emitting component or photodetector (filter, antireflection coating) can be influenced. Thus a version of the optical component has thicknesses and refractive indexes of the layers forming an interference filter and can be utilized as such.

The filter effect is achieved by a periodic sequence of layers with different optical characteristics (dielectric functions). Depending upon the layer sequence, different kinds of filters are attainable (band pass, band blocking, Fabry-Perot filters), whereby the filter effects can be combinable also by the series positioning of different types of filters. Such filters are usable in optics and also for influencing the emission characteristics for light emitting components (for example colored flat imaging screens also of porous silicon) and as accessory filters for photodiodes, for example, in color cameras.

The special advantage of porous silicon as the layer material derives not only from the easy inexpensive fabrication of optionally complex layers systems, but also in the possibility to achieve gradual variation in the refractive index.

A further variant of the optical component of the invention provides that the layers have a continuously varying refractive index and thus a reflection reducing or a reflection enhancing effect. The gradual transitions of the refractive indexing are required to achieve optimum waveguiding in a light pipe as is the case with glass fibers. Through this possibility to provide gradual transitions in refractive index even in layer systems of porous silicon, waveguides can be manufactured in a very simple manner upon a silicon chip. With a waveguide the layer sequence of porous silicon has a gradually increasing and then gradually decreasing refractive index. Apart from the filter effect of layer systems, it is possible to produce a gradual change in the optical characteristics of a layer system of porous silicon as a reflection reducing/reflection enhancing cover layer. This cover layer can be used for reducing the internal reflections in outputting of light in the case of light emitting structures used as waveguides and also for reducing the reflectivity of photodetectors or as an anti-reflection coatings, e.g. for solar cells.

BRIEF DESCRIPTION OF THE DRAWINGS

In the drawing layer systems according to the invention have been schematically illustrated and are described below. In the drawing

DESCRIPTION OF THE PREFERRED EMBODIMENTS

Figure 1:
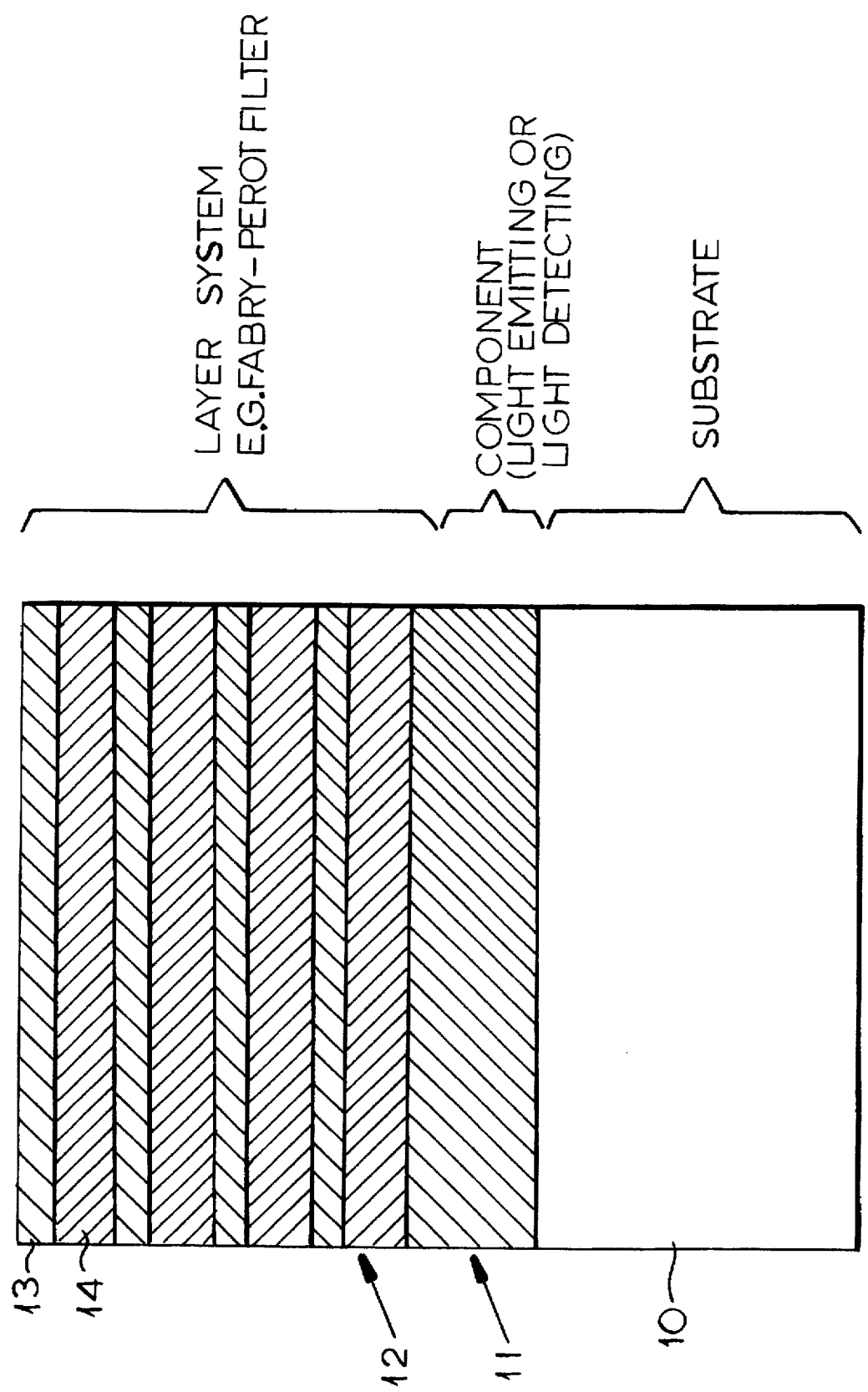
FIG. 1 is a diagrammatic section through a layer system of the invention, forming an optical filter.

FIG. 1 shows a structure which combines a Fabry-Perot filter with a light emitting or light detecting component.

Directly upon the substrate 10 there is found the significant part of the component 11 which is either light detecting or light emitting. To achieve a small-band sensitivity of the detector or a small band emission of light, upon this layer a layer system 12 is formed which is effective as a filter. To achieve a filter effect, layers 13, 14 are applied of different porosity and also refractive indices of different magnitudes. To create a filter with a wavelength 1, alternately high porosity and low porosity layers are fabricated which all have an optical path length of ¼ many of these layers form the layer system. This layer system can be a Fabry-Perot filter.

The total structure is produced in a single etching process electrochemically from a silicon wafer.

Figure 2A:
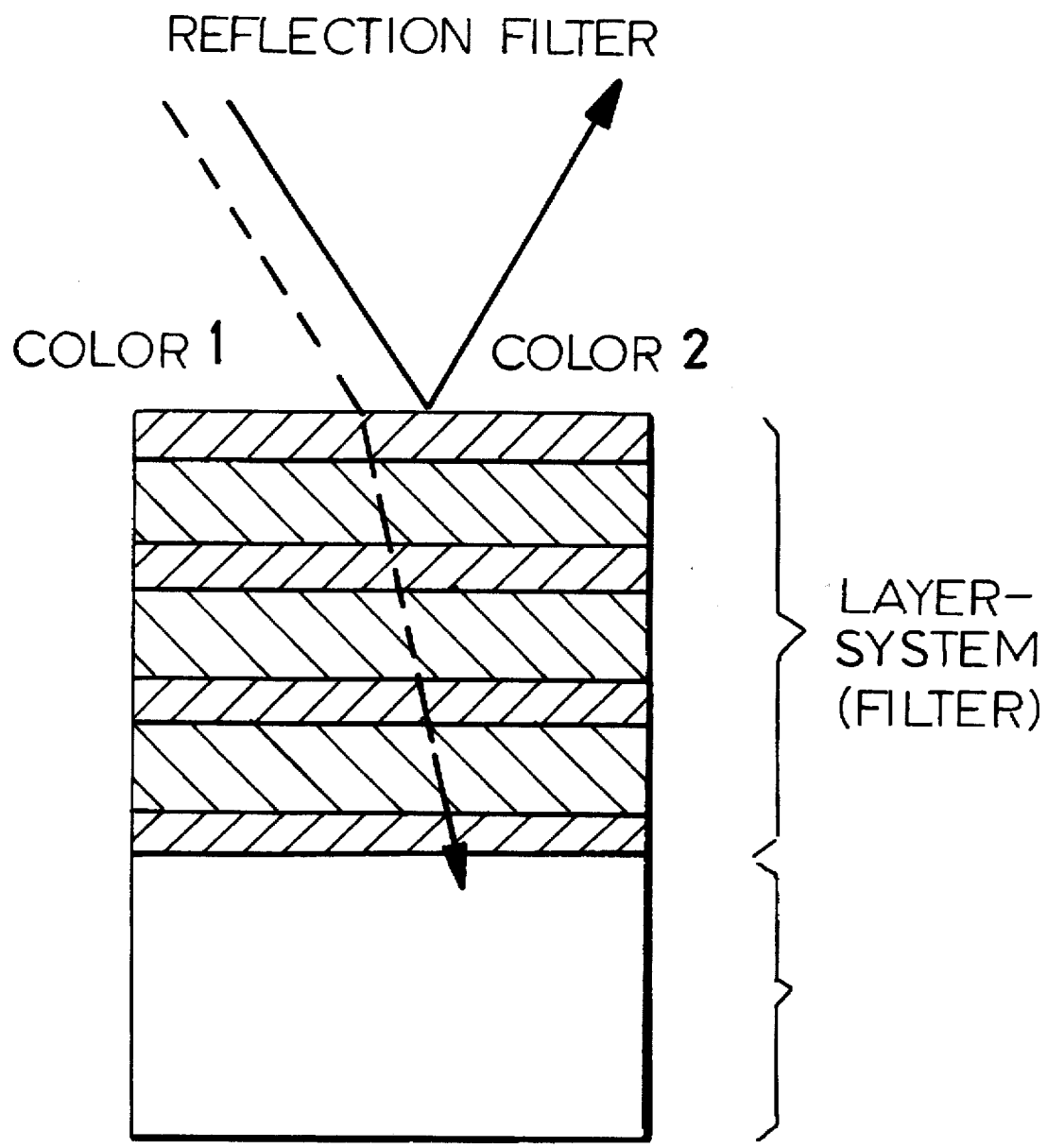
FIGS. 2A and 2B are views similar to FIG. 1 showing different applications of the filter layer system, namely, a reflection filter and a color splitter.

FIG. 2A shows a layer system can be produced which is transparent to the wavelength of the color 1 while it forms for the wavelength of the color 2 a highly reflective mirror. If this structure is produced on a wafer, one has a reflection filter for a predetermined wavelength. All other wavelengths are absorbed in the component. This kind of application is shown at the left side of the figure.

Figure 2B:
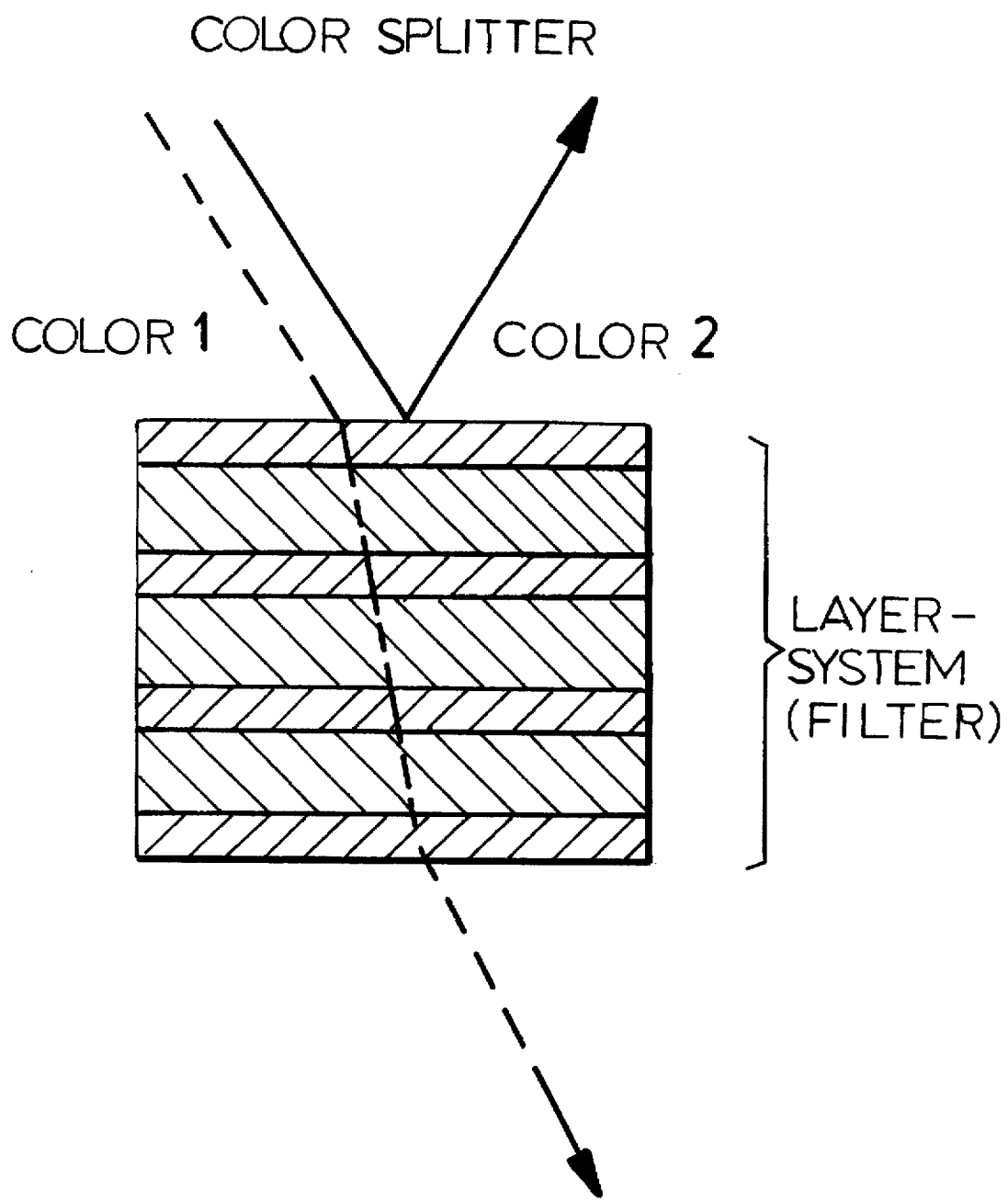
Figure 3:
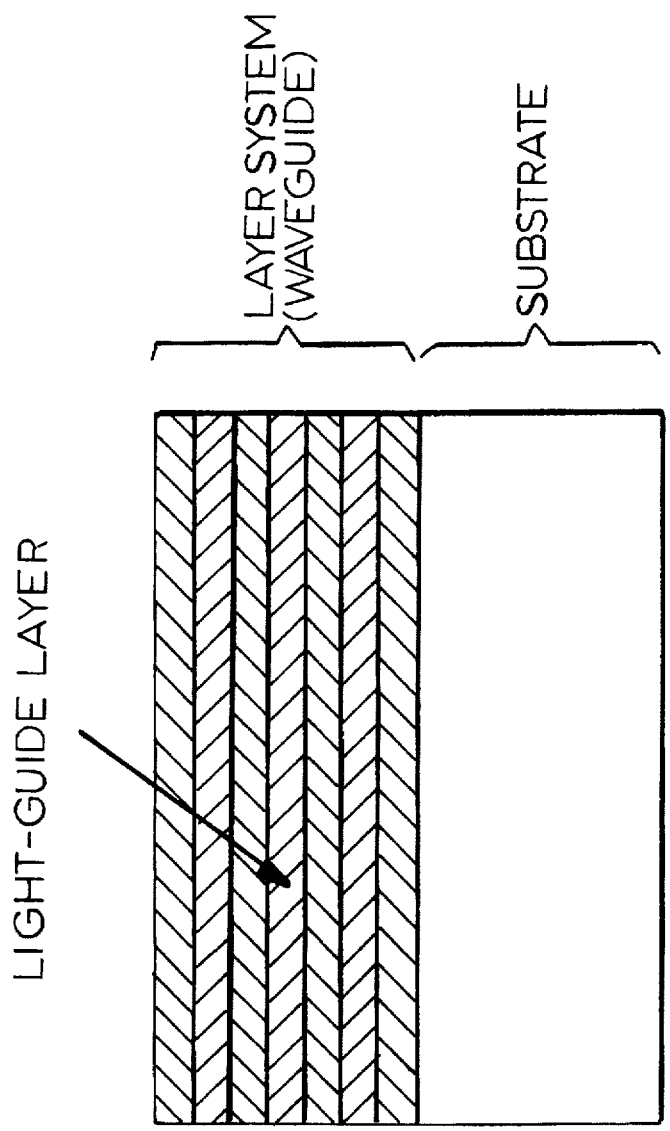
FIG. 3 is a similar view of a layer system as a waveguide.
Figure 3A:
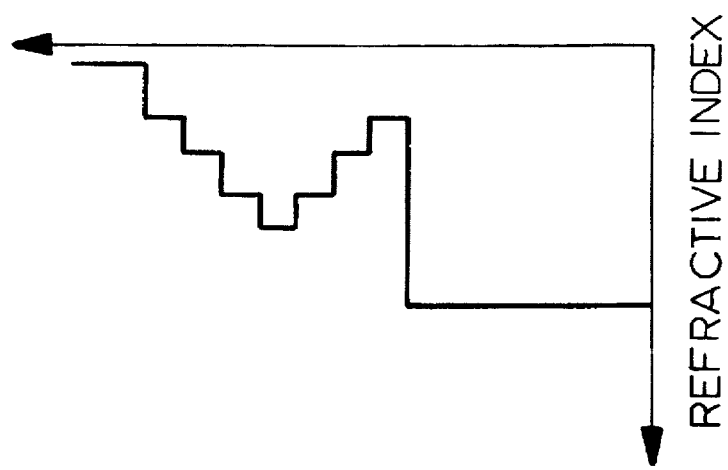
FIG. 3A is a graph of the refractive index associated therewith.
Figure 4:
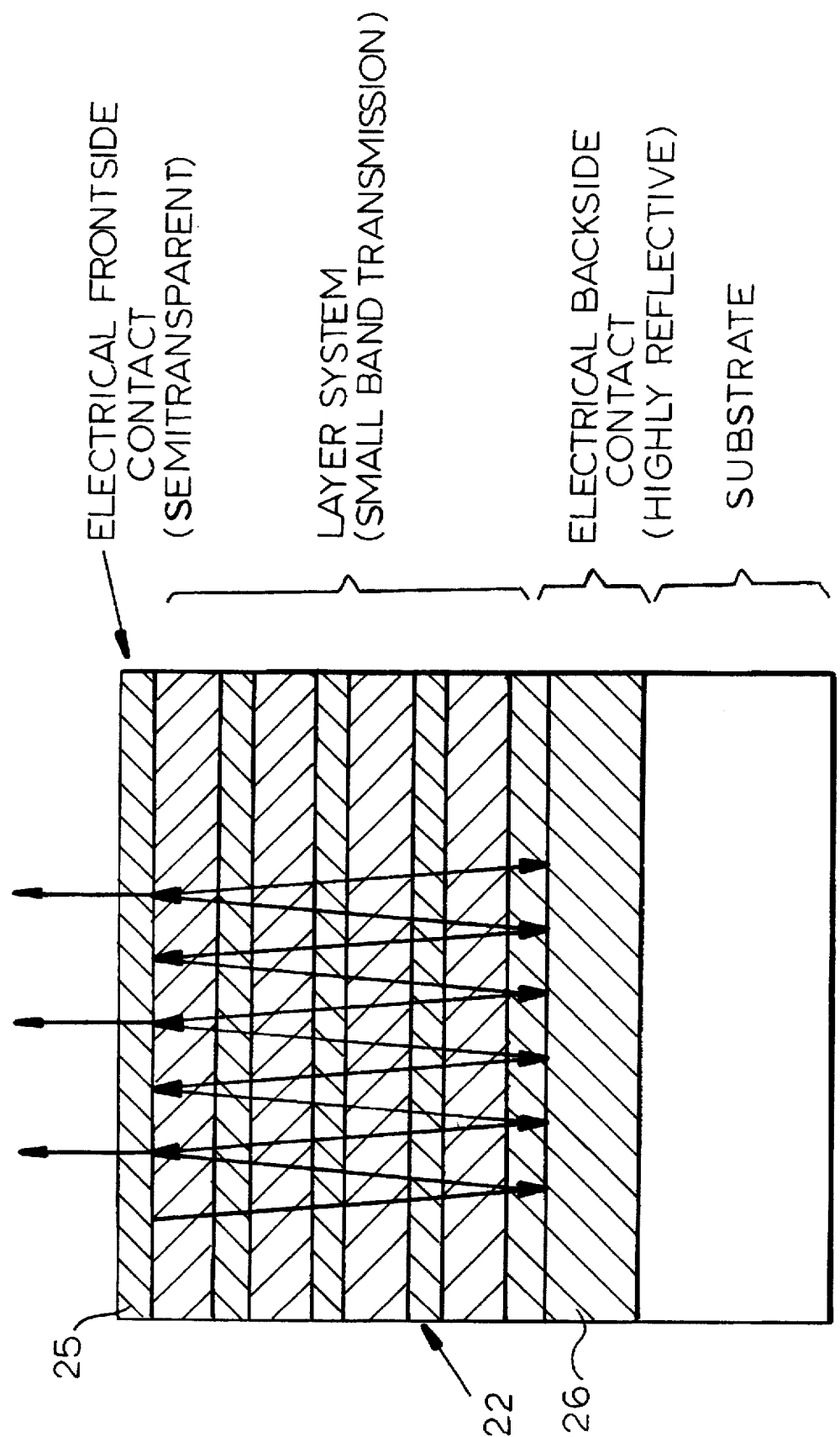
FIG. 4 is a diagrammatic section of a laser structure based upon a layer system.

When the nonreflected wavelengths are also desired, the filter can be self-supporting as shown in FIG 2B. In this way a color splitter is formed which reflects a predetermined wavelength and is transparent to the others.

Upon a porous layer 22, a semi-transparent front side contact 25, is applied and below the porous layer a highly reflective electrical back side contact 26 so that a resonator for a predetermined wavelength is produced. To fabricate a laser of silicon, a mechanism is required which suppresses induced emissions in false wavelength ranges. Thus the layers are produced in the resonator as an overgrid which has a small transmission band for the desired wavelengths. In this manner it is possible in spite of the broad band luminescence of the porous silicon to fabricate a laser from this material.

We claim:

1. An optical element comprising a plurality of transparent thin layers composed of porous silicon, wherein each said porous silicon layer has a thickness and a refractive index different from each other said layer.

2. An optical element according to claim 1, wherein said porous silicon layers have thicknesses and refractive indices arranged as a layer sequence for acting as one of an optical interference filter and an optical interference mirror.

3. An optical element according to claim 1, wherein each of said layers has a continuously varying refractive index.

4. An optical element according to claim 3, wherein said porous silicon layers are arranged as a sequence of layers having a gradually increasing and then gradually decreasing refractive index.

* * * * *